US012787841B2

(12) United States Patent
Ryu et al.

(10) Patent No.: US 12,787,841 B2
(45) Date of Patent: Nov. 3, 2026

(54) SEMICONDUCTOR PACKAGE HAVING A BLOCKING LAYER ON A SOLDER BALL

(71) Applicant: Samsung Electronics Co., Ltd., Suwon-si (KR)

(72) Inventors: Hansung Ryu, Suwon-si (KR); Yongsung Park, Suwon-si (KR); Jongbeom Park, Suwon-si (KR); Junho Lee, Suwon-si (KR); Jihyun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 429 days.

(21) Appl. No.: 18/240,273

(22) Filed: Aug. 30, 2023

(65) Prior Publication Data

US 2024/0105657 A1 Mar. 28, 2024

(30) Foreign Application Priority Data

Sep. 23, 2022 (KR) ........................ 10-2022-0121115

(51) Int. Cl.
*H10W 72/20* (2026.01)
*H10W 90/00* (2026.01)

(52) U.S. Cl.
CPC .......... *H10W 72/20* (2026.01); *H10W 72/223* (2026.01); *H10W 72/232* (2026.01);
(Continued)

(58) Field of Classification Search
CPC . H10W 72/20; H10W 72/223; H10W 72/232; H10W 72/252; H10W 72/012; H10W 72/019; H10W 72/072; H10W 72/90; H10W 72/07254; H10W 72/221; H10W 72/222; H10W 72/234; H10W 72/235; H10W 72/241; H10W 72/245; H10W 72/255; H10W 72/29; H10W 90/722; H10W 90/724
See application file for complete search history.

(56) References Cited

U.S. PATENT DOCUMENTS 6,337,445 B1 * 1/2002 Abbott ................. H05K 3/3436
174/257
6,610,591 B1 * 8/2003 Jiang .................... H05K 3/3436
257/E21.511
(Continued)

FOREIGN PATENT DOCUMENTS

JP 5630060 B2 11/2014
KR 1020070053555 A 5/2007

OTHER PUBLICATIONS

Cheng, Jinxuan et al., "Effects of the Ni(P) plating thickness on microstructure evolution of interfacial IMCs in Sn-58Bi/Ni(P)/Cu solder joints," Journal of Materials Science: Materials in Electronics, (2020).
(Continued)

*Primary Examiner* — Wael M Fahmy
*Assistant Examiner* — Tiberiu Dan Onuta
(74) *Attorney, Agent, or Firm* — Muir Patent Law, PLLC

(57) ABSTRACT

A semiconductor package includes a first substrate, a first bonding pad on the first substrate, a solder ball on the first bonding pad, and a blocking layer on the solder ball, wherein a thickness of the blocking layer varies in a direction away from the first substrate.

20 Claims, 16 Drawing Sheets

(52) U.S. Cl.
CPC ........ *H10W 72/252* (2026.01); *H10W 90/722* (2026.01); *H10W 90/724* (2026.01)

(56) References Cited

U.S. PATENT DOCUMENTS

| | | | | |
|---|---|---|---|---|
| 7,122,460 | B2 | 10/2006 | Hua | |
| 7,276,801 | B2 | 10/2007 | Dubin et al. | |
| 7,485,564 | B2 | 2/2009 | Daubenspeck et al. | |
| 8,592,995 | B2 | 11/2013 | Lin et al. | |
| 9,455,183 | B2 | 9/2016 | Hsiao et al. | |
| 9,613,921 | B2 | 4/2017 | Daubenspeck et al. | |
| 9,620,469 | B2 | 4/2017 | Chen et al. | |
| 9,698,088 | B2 * | 7/2017 | Kwon | H01L 23/49816 |
| 10,083,939 | B2 | 9/2018 | Seo et al. | |
| 2002/0151164 | A1 | 10/2002 | Jiang et al. | |
| 2017/0005051 | A1 * | 1/2017 | Hsiao | H10D 64/011 |
| 2021/0375811 | A1 * | 12/2021 | Son | H01L 25/115 |
| 2022/0216071 | A1 * | 7/2022 | Chen | B23K 1/0016 |

OTHER PUBLICATIONS

H. Fu et al., "iNEMI project on process development of BISN-based low temperature solder pastes—Part II: Characterization of mixed alloy BGA solder joints," 2018 Pan Pacific Microelectronics Symposium (Pan Pacific), Big Island, HI, USA, 2018, pp. 1-17.

S. Sahasrabudhe et al., "Low Temperature Solder—A Breakthrough Technology for Surface Mounted Devices," 2018 IEEE 68th Electronic Components and Technology Conference (ECTC), San Diego, CA, USA, 2018, pp. 1455-1464.

* cited by examiner

SEMICONDUCTOR PACKAGE HAVING A BLOCKING LAYER ON A SOLDER BALL

CROSS-REFERENCE TO RELATED APPLICATION

This application is based on and claims priority under 35 U.S.C. § 119 to Korean Patent Application No. 10-2022-0121115, filed on Sep. 23, 2022, in the Korean Intellectual Property Office, the disclosure of which is incorporated by reference herein in its entirety.

BACKGROUND

The inventive concept relates to a semiconductor package, and more particularly, to a semiconductor package including a solder ball.

Bonding methods using metal alloys having different melting temperatures are used for semiconductor packaging. One of the bonding methods is soldering. Sn—Ag—Cu (SAC) solder including an alloy of metal materials, such as tin (Sn), silver (Ag), and copper (Cu), is a representative material of materials mainly used for soldering.

While SAC solder has a maximum bonding temperature of about 235° C. to about 245° C., low melting solder including bismuth (Bi), zinc (Zn), indium (In), or the like has a low maximum bonding temperature of 200° C. or lower and thus reduces bonding cost and $CO_2$ emission. Accordingly, the low melting solder is environment-friendly.

In hybrid systems, in which low-temperature solder paste is applied only to solder of a substrate and SAC solder is used as semiconductor packaging solder, when a Bi component of the low-temperature solder paste is excessively diffused into the SAC solder, brittleness increases, thereby decreasing the lifespan of a solder joint.

SUMMARY

The inventive concept provides a semiconductor package including a solder joint, which is easy to manufacture and has increased durability.

The inventive concept is not limited to what is mentioned above and will be clearly understood by those skilled in the art from the descriptions below.

According to an aspect of the inventive concept, there is provided a semiconductor package including a first substrate, a first bonding pad on the first substrate, a solder ball on the first bonding pad, and a blocking layer on the solder ball, wherein a thickness of the blocking layer varies in a direction away from the first substrate.

According to another aspect of the inventive concept, there is provided a semiconductor package including a first substrate, a first bonding pad on the first substrate, a solder ball on the first bonding pad, and a blocking layer on the solder ball and having a first hole, wherein the first hole extends from an outer surface of the blocking layer to an inner surface of the blocking layer.

According to a further aspect of the inventive concept, there is provided a semiconductor package including a first substrate, a first bonding pad on the first substrate, a solder ball on the first bonding pad, a blocking layer on the solder ball, a second substrate separated from the first substrate by the solder ball therebetween, a second bonding pad on the second substrate, and solder paste on the second bonding pad and combined with the solder ball, wherein a thickness of the blocking layer decreases in a direction toward the second substrate, the solder ball has a higher melting point than the solder paste, and a distance between the first bonding pad and the solder paste is about 10% to about 30% of a distance between the first bonding pad and the second bonding pad.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

The embodiments may include various modifications and different forms. The detailed description will be set forth with reference to the drawings showing specific embodiments. However, the embodiments will not be restricted to the specific embodiments.

Figure 1:
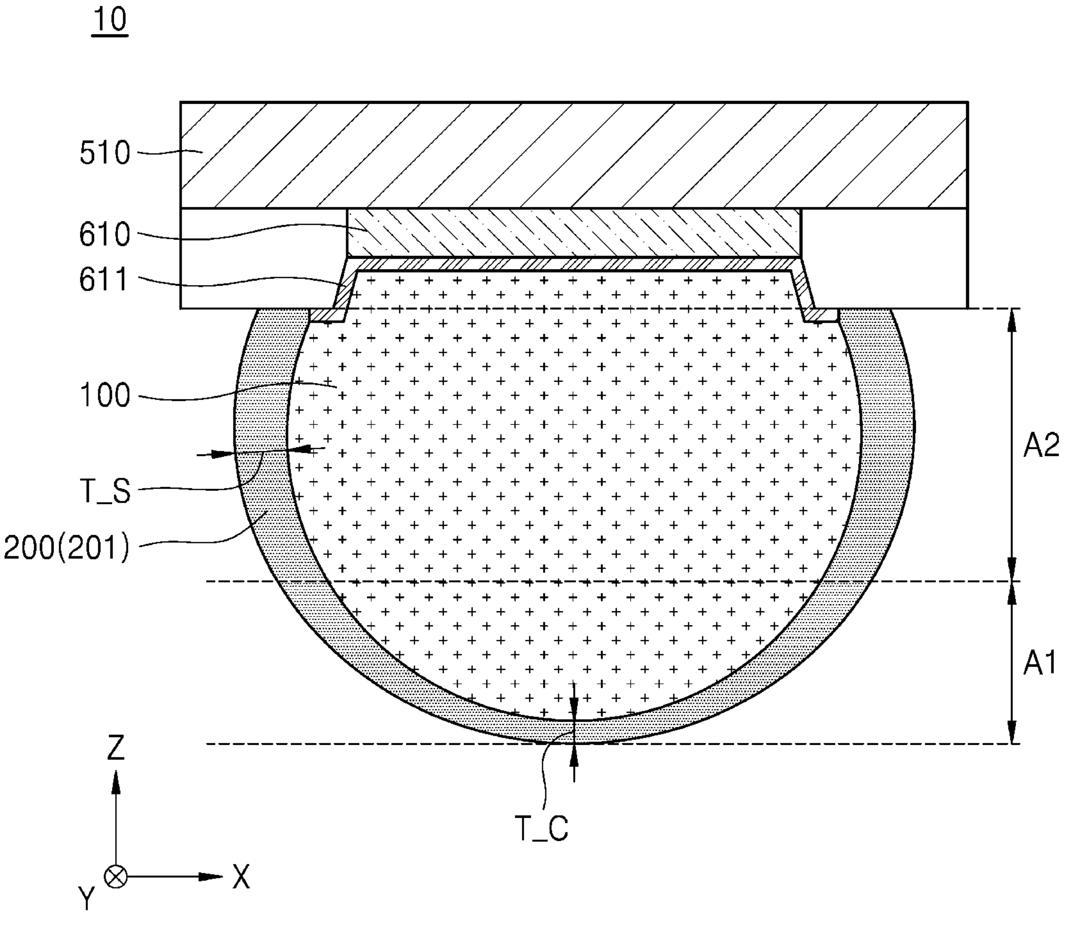
FIG. 1 is a schematic cross-sectional view of a semiconductor package according to an embodiment.

FIG. 1 is a schematic cross-sectional view of a semiconductor package according to an embodiment.

Referring to FIG. 1, a semiconductor package 10 may include a first substrate 510, a first bonding pad 610, a solder ball 100, and a blocking layer 201.

The first substrate 510 of the semiconductor package 10 may include a material (e.g., silicon or germanium) having semiconductor properties, an insulating material (e.g., glass or quartz), or a semiconductor or conductor covered with an insulating material.

In some embodiments, the first substrate 510 may correspond to a wafer including silicon. Alternatively, the first substrate 510 may correspond to a wafer including a semiconductor element, e.g., germanium (Ge), or a compound semiconductor, such as silicon carbide (SiC), gallium arsenide (GaAs), indium arsenide (InAs), or indium phosphide (InP). The first substrate 510 may have a silicon-on-insulator (SOI) structure.

The first bonding pad 610 of the semiconductor package 10 may be on the first substrate 510. An external connection terminal may be attached to the first bonding pad 610. The external connection terminal may be configured to electrically and physically connect the first substrate 510 to an external device, on which the first substrate 510 is mounted. For example, the external connection terminal may be formed as the solder ball 100. The first bonding pad 610 may be electrically connected to another first bonding pad by a metal interconnection structure inside the first substrate 510.

For example, the first bonding pad 610 may include metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof.

In some embodiments, the semiconductor package 10 may include a lower metal layer 611. The lower metal layer 611 may cover the first bonding pad 610 and a portion of a passivation layer adjacent to the first bonding pad 610. The lower metal layer 611 may be between the solder ball 100 and the first bonding pad 610 and may correspond to a seed layer for forming the solder ball 100, an adhesive layer, or a barrier layer. In some embodiments, the lower metal layer 611 may include chromium (Cr), W, Ti, Cu, Ni, Al, palladium (Pd), gold (Au), or a combination thereof.

Although the lower metal layer 611 is constituted of a single layer in FIG. 1, the lower metal layer 611 may have a stack structure including a plurality of metal layers. For example, the lower metal layer 611 may include a first metal layer, a second metal layer, and/or a third metal layer, which are sequentially stacked on the first bonding pad 610 and a passivation layer (not illustrated). The first metal layer may function as an adhesive layer, which stably attaches the solder ball 100 thereon to the first bonding pad 610 and/or the passivation layer. The first metal layer may include a metal material having high adhesion to the passivation layer. For example, the first metal layer may include at least one selected from the group consisting of Ti, Ti—W, Cr, and Al. The second metal layer may function as a barrier layer, which prevents a metal material included in the solder ball 100 from diffusing into the first substrate 510. The second metal layer may include at least one selected from the group consisting of Cu, Ni, Cr—Cu, and nickel vanadium (Ni—V). The third metal layer may function as a wetting layer, which enhances the wetting characteristics of a seed layer or solder layer for forming the solder ball 100. The third metal layer may include at least one selected from the group consisting of Ni, Cu, and Al.

The solder ball 100 of the semiconductor package 10 may be on the first bonding pad 610. The solder ball 100 may have a spherical or ball shape. The solder ball 100 may electrically and physically connect the first bonding pad 610 to an external device, on which the first substrate 510 is mounted. For example, the solder ball 100 may include at least one selected from the group consisting of Sn—Ag—Cu alloy, Sn—Bi alloy, Sn—Bi—Ag alloy, and Sn—Ag—Cu—Ni alloy. For example, the solder ball 100 may include at least one selected from the group consisting of Sn—Ag (0.3-3)-Cu (0.1-1), Sn—Bi (35-75), Sn—Bi (35-75)-Ag (0.1-20), and Sn—Ag (0.5-5)-Cu (0.1-2)-Ni (0.05-0.1). For example, when the solder ball 100 is constituted of Sn—Ag—Cu alloy, the solder ball 100 may include SAC305 (Sn-3.0Ag-0.5Cu) or SAC205 (Sn-2.0Ag-0.5Cu).

The blocking layer 201 of the semiconductor package 10 may be on the solder ball 100. The thickness of the blocking layer 201 may vary in a direction away from the first substrate 510. In some embodiments, the thickness of the blocking layer 201 may decrease away from the first substrate 510. In other words, the blocking layer 201 may be disposed along the outer surface of the solder ball 100 having a ball shape. The thickness of the blocking layer 201 may decrease away from the first substrate 510 in a vertical direction.

In some embodiments, the blocking layer 201 may include a first region A1 and a second region A2. The first region A1 may be apart from the first substrate 510, and the second region A2 may be between the first region A1 and the first substrate 510. The thickness of the blocking layer 201 in the first region A1 may be a first thickness T_C, and the thickness of the blocking layer 201 in the second region A2 may be a second thickness T_S. The first thickness T_C may be less than the second thickness T_S. In other words, the blocking layer 201 may be thinner away from the first substrate 510.

In some embodiments, the blocking layer 201 may be disposed along the outer surface of the solder ball 100. The solder ball 100 may include a side area and center area. The center area of the solder ball 100 may be apart from the first substrate 510 by about 40% to about 70% of the height of the solder ball 100. The side area may be between the center area and the first substrate 510. The thickness of the blocking layer 201 on the center area of the solder ball 100 may be less than the thickness of the blocking layer 201 on the side area of the solder ball 100. In other words, the thickness of the blocking layer 201 may vary with the areas of the solder ball 100.

The blocking layer 201 may have a thickness of about 0.05 μm to about 0.2 μm in the first region A1 and a thickness of about 0.2 μm to about 0.4 μm in the second region A2.

During a reflow process, solder paste may be combined with the solder ball 100. When the solder ball 100 is combined with solder paste, solder particles of the solder paste may diffuse into the solder ball 100. When the thickness of the blocking layer 201 increases, diffusion of solder particles may be suppressed. The blocking layer 201 has a thickness of about 0.2 μm to about 0.4 μm in the second region A2, thereby suppressing diffusion of solder particles. The blocking layer 201 has a thickness of about 0.05 μm to about 0.2 μm in the first region A1 such that the solder ball 100 may be physically and electrically connected to solder paste.

In some embodiments, the blocking layer 201 may include Ni, boron (B), phosphorous (P), or a compound thereof.

Because the blocking layer 201 of the semiconductor package 10 has different thicknesses in different regions, diffusion of solder particles of solder paste may be controlled according to the thicknesses of the blocking layer 201 during a reflow process. In other words, solder particles of solder paste may be prevented from diffusing to the solder ball 100 in a region, in which the blocking layer 201 has a large thickness.

When solder particles of solder paste diffuse to the boundary between the first substrate 510 and the solder ball 100, a bonding force between the solder ball 100 and the solder paste may be weakened in the boundary region therebetween and easily broken by external impact. The blocking layer 201 may prevent solder particles of solder paste from diffusing to the boundary of the first substrate 510, thereby increasing the reliability of the semiconductor package 10.

Figure 2:
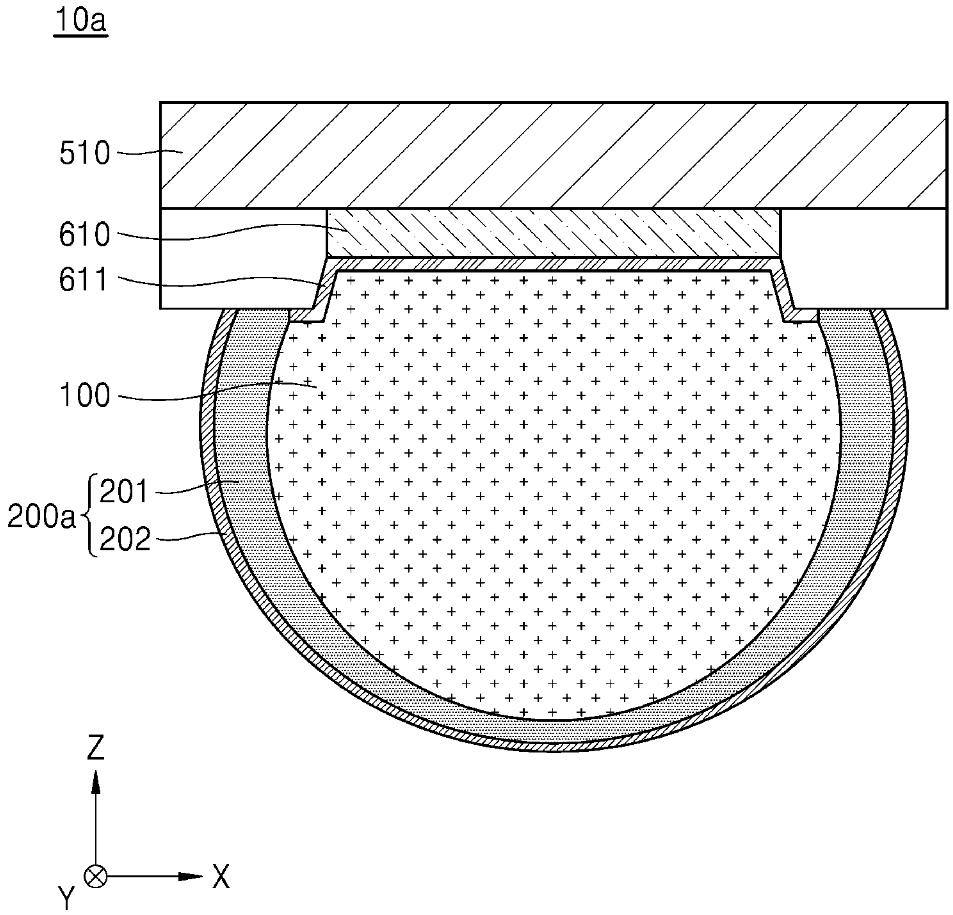
FIG. 2 is a schematic cross-sectional view of a semiconductor package according to an embodiment.

FIG. 2 is a schematic cross-sectional view of a semiconductor package according to an embodiment.

Hereinafter, redundant descriptions of the semiconductor package 10 of FIG. 1 are omitted, and a semiconductor package 10*a* of FIG. 2 is described focusing on the differences from the semiconductor package 10.

The semiconductor package 10*a* may further include a first adhesive layer 202. The first adhesive layer 202 of the semiconductor package 10*a* may be on the outer surface of the blocking layer 201. In some embodiments, the first adhesive layer 202 may have a uniform thickness. The first adhesive layer 202 may cover the surface of the blocking layer 201. The first adhesive layer 202 may stably combine solder paste thereon with the solder ball 100. In other words, the first adhesive layer 202 may have better wettability with respect to solder paste than the blocking layer 201 and thus increase the bonding force between the solder paste and the solder ball 100.

In some embodiments, the first adhesive layer 202 may include at least one selected from the group consisting of Au, Co, Cr, Cu, Ti, W, and a compound thereof.

In some embodiments, the first adhesive layer 202 may include a different material than the blocking layer 201. The blocking layer 201 may be between the first adhesive layer 202 and the solder ball 100. The first adhesive layer 202 may be provided to increase bonding between the blocking layer 201 and solder paste. The semiconductor package 10*a* may increase bonding between solder paste and the solder ball 100 via the first adhesive layer 202, thereby increasing the reliability thereof.

In some embodiments, the blocking layer 201 and the first adhesive layer 202 may be formed after the solder ball 100 is attached to the first bonding pad 610. In some embodiments, the blocking layer 201 and the first adhesive layer 202 may be formed by sputtering, vapor deposition, or the like. The blocking layer 201 may have a different thickness than the first adhesive layer 202. In some embodiments, the thickness of the blocking layer 201 may decrease away from the first substrate 510, and the thickness of the first adhesive layer 202 may be constant.

Figure 3:
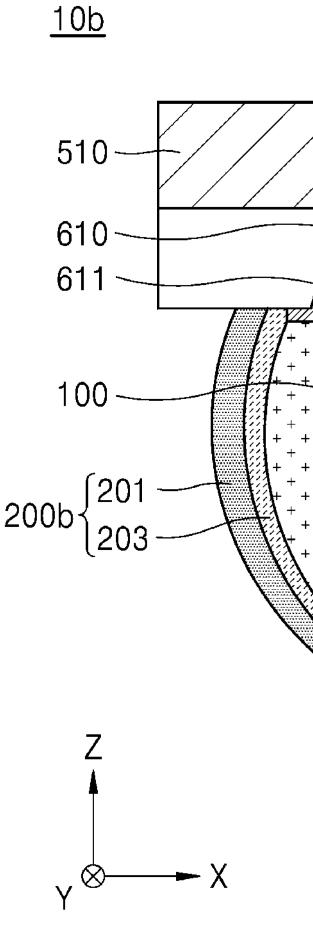
FIG. 3 is a schematic cross-sectional view of a semiconductor package according to an embodiment.

FIG. 3 is a schematic cross-sectional view of a semiconductor package according to an embodiment.

Hereinafter, redundant descriptions of the semiconductor package 10 of FIG. 1 are omitted, and a semiconductor package 10*b* of FIG. 3 is described focusing on the differences from the semiconductor package 10.

The semiconductor package 10*b* may further include a second adhesive layer 203. The second adhesive layer 203 of the semiconductor package 10*b* may be between the blocking layer 201 and the solder ball 100. In some embodiments, the second adhesive layer 203 may have a uniform thickness. The second adhesive layer 203 may cover the surface of the solder ball 100. The second adhesive layer 203 may stably combine the blocking layer 201 thereon with the solder ball 100. In other words, the second adhesive layer 203 may provide better bonding to the solder ball 100 than the blocking layer 201 and thus increase the bonding force between the blocking layer 201 and the solder ball 100. When the bonding force between the blocking layer 201 and the solder ball 100 is increased, the reliability of the semiconductor package 10*b* may also be increased.

In some embodiments, the second adhesive layer 203 may include at least one selected from the group consisting of Au, Co, Cr, Cu, Ti, W, and a compound thereof. In some embodiments, the second adhesive layer 203 may include a different material than the blocking layer 201.

In some embodiments, the blocking layer 201 and the second adhesive layer 203 may be formed after the solder ball 100 is attached to the first bonding pad 610. In some embodiments, the blocking layer 201 and the second adhesive layer 203 may be formed by sputtering, vapor deposition, or the like. The blocking layer 201 may have a different thickness than the second adhesive layer 203. In some embodiments, the thickness of the blocking layer 201 may decrease away from the first substrate 510, and the thickness of the second adhesive layer 203 may be constant.

Figure 4:
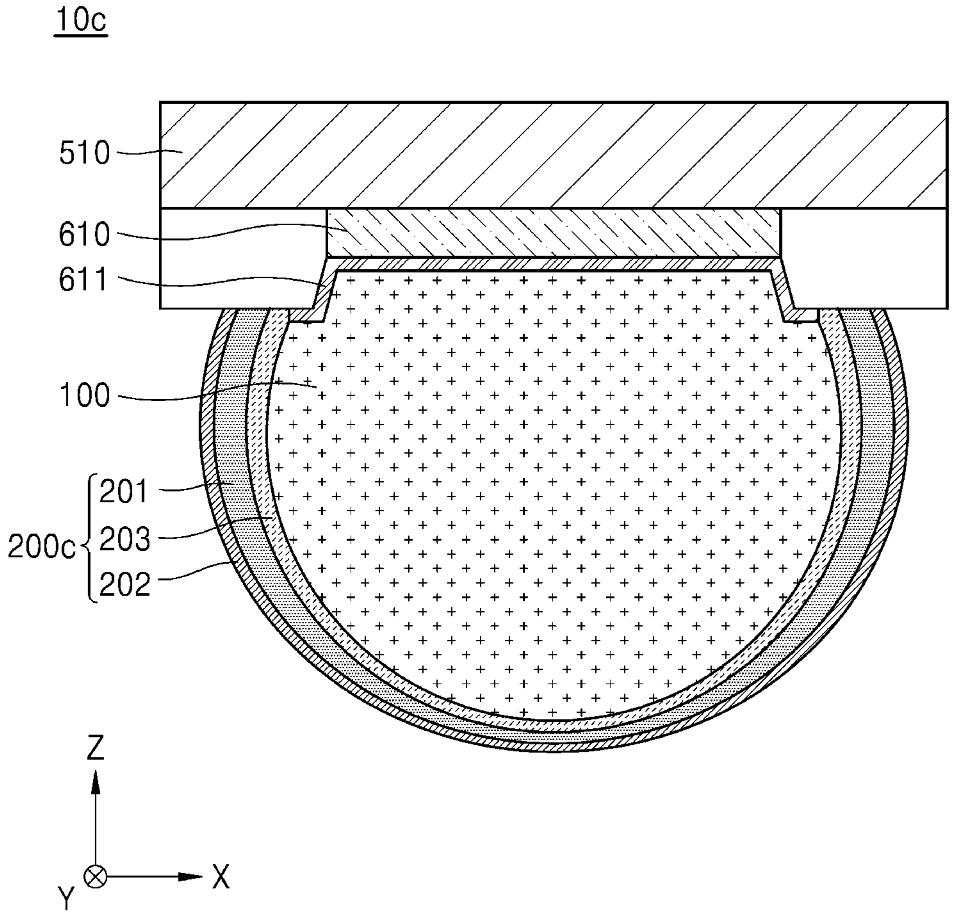
FIG. 4 is a schematic cross-sectional view of a semiconductor package according to an embodiment.

FIG. 4 is a schematic cross-sectional view of a semiconductor package according to an embodiment.

Hereinafter, redundant descriptions of the semiconductor package 10 of FIG. 1 are omitted, and a semiconductor package 10*c* of FIG. 4 is described focusing on the differences from the semiconductor package 10.

The semiconductor package 10*c* may further include the first adhesive layer 202 and the second adhesive layer 203. The first adhesive layer 202 of the semiconductor package 10*c* may be on the outer surface of the blocking layer 201. In some embodiments, the first adhesive layer 202 may have a uniform thickness. The first adhesive layer 202 may cover the surface of the blocking layer 201. The first adhesive layer 202 may stably combine solder paste thereon with the solder ball 100. In other words, the first adhesive layer 202 may have better wettability with respect to solder paste than the blocking layer 201 and thus increase the bonding force between the solder paste and the solder ball 100.

The second adhesive layer 203 of the semiconductor package 10*c* may be between the blocking layer 201 and the solder ball 100. In some embodiments, the second adhesive layer 203 may have a uniform thickness. The second adhesive layer 203 may cover the surface of the solder ball 100. The second adhesive layer 203 may stably combine the blocking layer 201 thereon with the solder ball 100. In other words, the second adhesive layer 203 may provide better bonding to the solder ball 100 than the blocking layer 201 and thus increase the bonding force between the blocking layer 201 and the solder ball 100. When the bonding force between the blocking layer 201 and the solder ball 100 is increased, the reliability of the semiconductor package 10*c* may also be increased.

In some embodiments, the blocking layer 201 may include Ni, B, P, or a compound thereof.

In some embodiments, the first adhesive layer 202 and the second adhesive layer 203 may include at least one selected from the group consisting of Au, Co, Cr, Cu, Ti, W, and a compound thereof.

Figure 5:
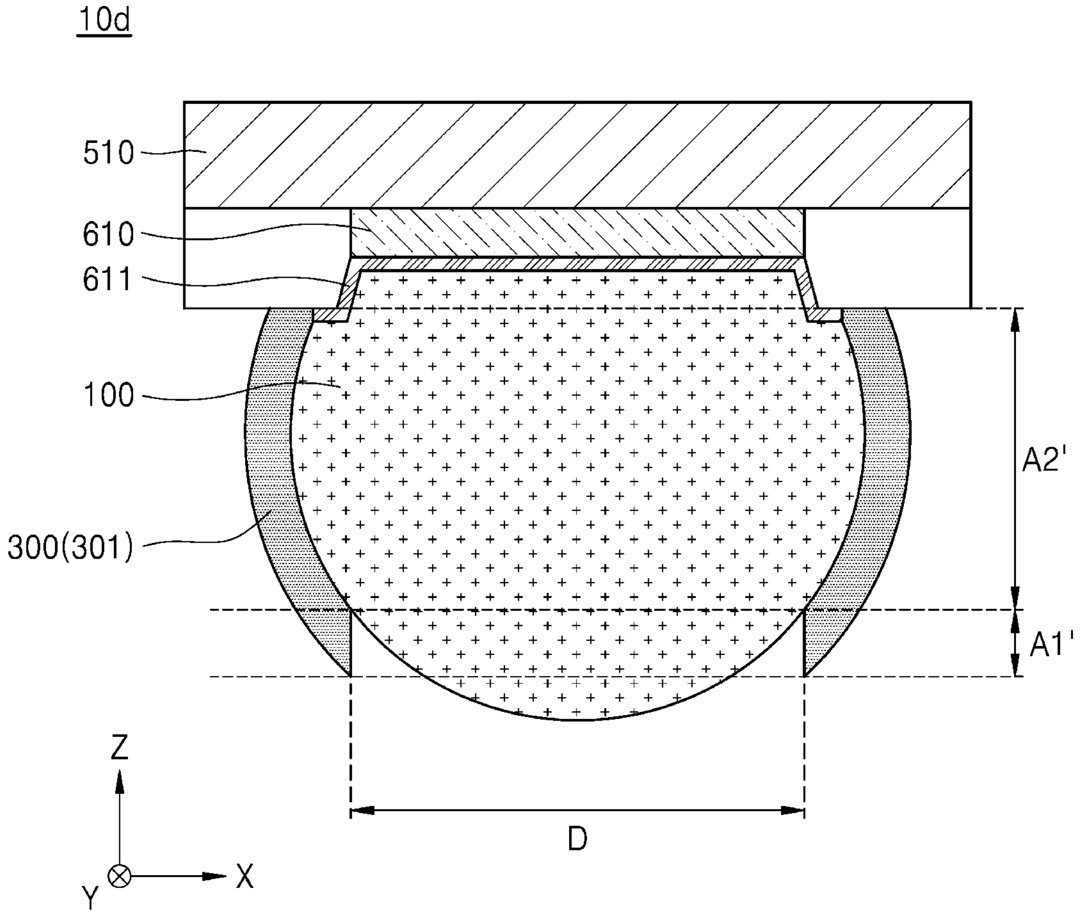
FIG. 5 is a schematic cross-sectional view of a semiconductor package according to an embodiment.
Figure 6A:
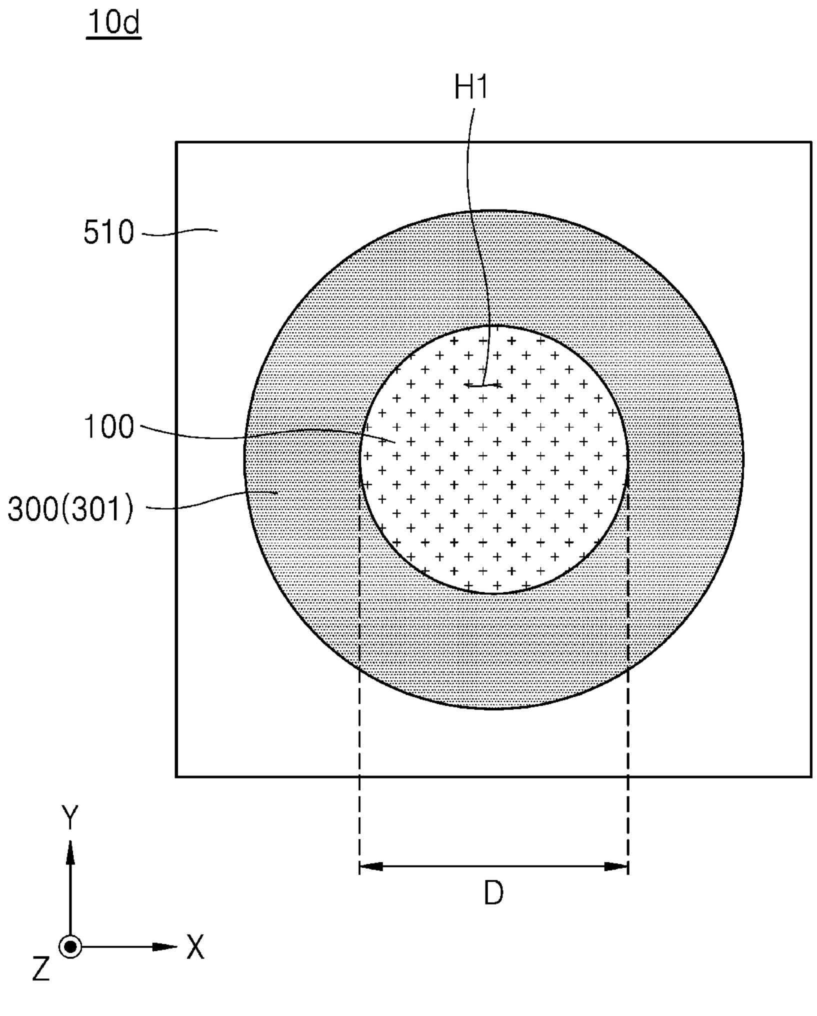
FIGS. 6A and 6B are schematic plan views of semiconductor packages according to embodiments.

FIG. 5 is a schematic cross-sectional view of a semiconductor package according to an embodiment. FIG. 6A is a schematic plan view of a semiconductor package according to an embodiment.

Referring to FIGS. 5 and 6A, a semiconductor package 10*d* may include the first substrate 510, the first bonding pad 610, the solder ball 100, and a blocking layer 301. Hereinafter, redundant descriptions of the semiconductor package 10 of FIG. 1 are omitted, and a semiconductor package 10*d* of FIGS. 5 and 6 is described focusing on the differences from the semiconductor package 10.

The blocking layer 301 of the semiconductor package 10*d* may be formed on the solder ball 100. The blocking layer 301 may have a first hole H1. The first hole H1 may extend from the outer surface of the blocking layer 301 to the inner surface of the blocking layer 301. In other words, at least a portion of the solder ball 100 may be exposed by the first hole H1 to the outside.

In some embodiments, the blocking layer 301 may include a first region A1' and a second region A2'. The first region A1' may be apart from the first substrate 510, and the second region A2' may be between the first region A1' and the first substrate 510. The first hole H1 may be in the first region A1'. In other words, a portion of the solder ball 100, which is in a region apart from the first substrate 510, may be exposed by the first hole H1 to the outside. In other words, in the first region A1' apart from the boundary between the first substrate 510 and the solder ball 100, the solder ball 100 may be exposed by the first hole H1 to the outside.

In some embodiments, the area of the first hole H1 may be about 30% to about 70% of the area of the solder ball 100. In other words, as shown in FIG. 6A, when the first hole H1 has a circular shape, a diameter D of the first hole H1 may be about 30% to about 70% of the diameter of the solder ball 100. In other words, the area of the solder ball 100 exposed by the first hole H1 may be about 30% to about 70% of the total area of the solder ball 100.

In some embodiments, the blocking layer 301 may include Ni, boron (B), phosphorus (P), or a compound thereof.

During a reflow process, the blocking layer 301 of the semiconductor package 10*d* may suppress solder particles of solder paste from diffusing into the solder ball 100. The blocking layer 301 may suppress solder particles of solder paste from diffusing to the boundary between the solder ball 100 and the first substrate 510, and the solder ball 100 may be combined with the solder paste through the first hole H1.

When solder particles of solder paste diffuse to the boundary between the first substrate 510 and the solder ball 100, a bonding force between the solder ball 100 and the solder paste may be weaken in the boundary region therebetween and easily broken by external impact. The blocking layer 301 may prevent solder particles of solder paste from diffusing to the boundary of the first substrate 510, thereby increasing the reliability of the semiconductor package 10*d*.

Figure 6B:
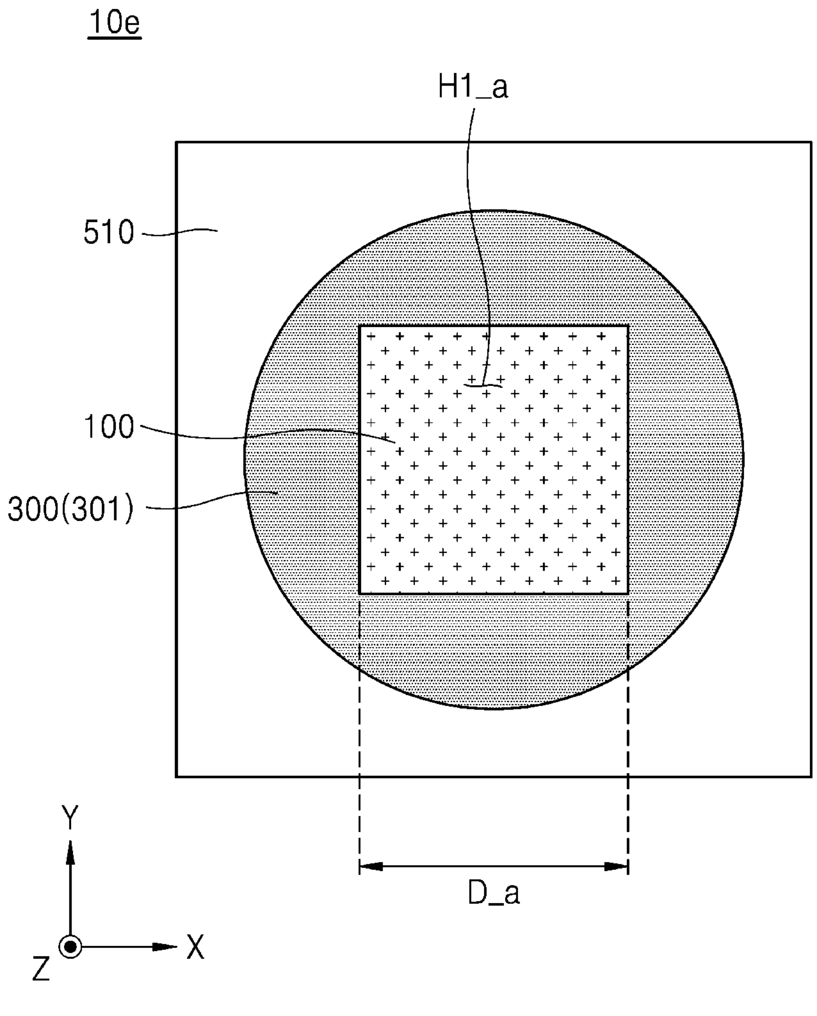

FIG. 6B is a schematic plan view of a semiconductor package according to an embodiment.

Hereinafter, redundant descriptions of the semiconductor package 10*d* of FIG. 5 are omitted, and a semiconductor package 10*e* of FIG. 6B is described focusing on the differences from the semiconductor package 10*d*.

The blocking layer 301 of the semiconductor package 10*e* may have a first hole H1_*a*. The blocking layer 301 may include a first region and a second region. The first region may be apart from the first substrate 510, and the second region may be between the first region and the first substrate 510. The first hole H1_*a* may be in the first region. In other words, a portion of the solder ball 100 in the first region may be exposed by the first hole H1_*a* to the outside.

The first hole H1_*a* may have a circular shape, an elliptical shape, a quadrangular shape, or a hexagonal shape. FIG. 6A shows the case where the first hole H1 has a circular shape, and FIG. 6B shows the case where the first hole H1_*a* has a quadrangular shape. Differently, the first hole H1_*a* may have an elliptical shape or a polygonal shape, e.g., a hexagonal shape.

In some embodiments, when the first hole H1_*a* has a quadrangular shape, the area of the first hole H1_*a* may be about 30% to about 70% of the area of the solder ball 100. In some embodiments, a distance D_a in a horizontal direction between side walls of the first hole H1_*a* may be about 30% to about 70% of the diameter of the solder ball 100.

In some embodiments, when a first hole has a hexagonal shape, the area of the first hole may be about 30% to about 70% of the area of a solder ball. In some embodiments, the longest distance between edges of side walls of a first hole may be about 30% to about 70% of the diameter of a solder ball.

In some embodiments, when a first hole has an elliptical shape, the area of the first hole may be about 30% to about 70% of the area of a solder ball. In some embodiments, the diffusion range of solder particles of solder paste may be adjusted according to the shape of a solder ball based on the curvature of an ellipse or the materials of the solder ball.

Figure 7:
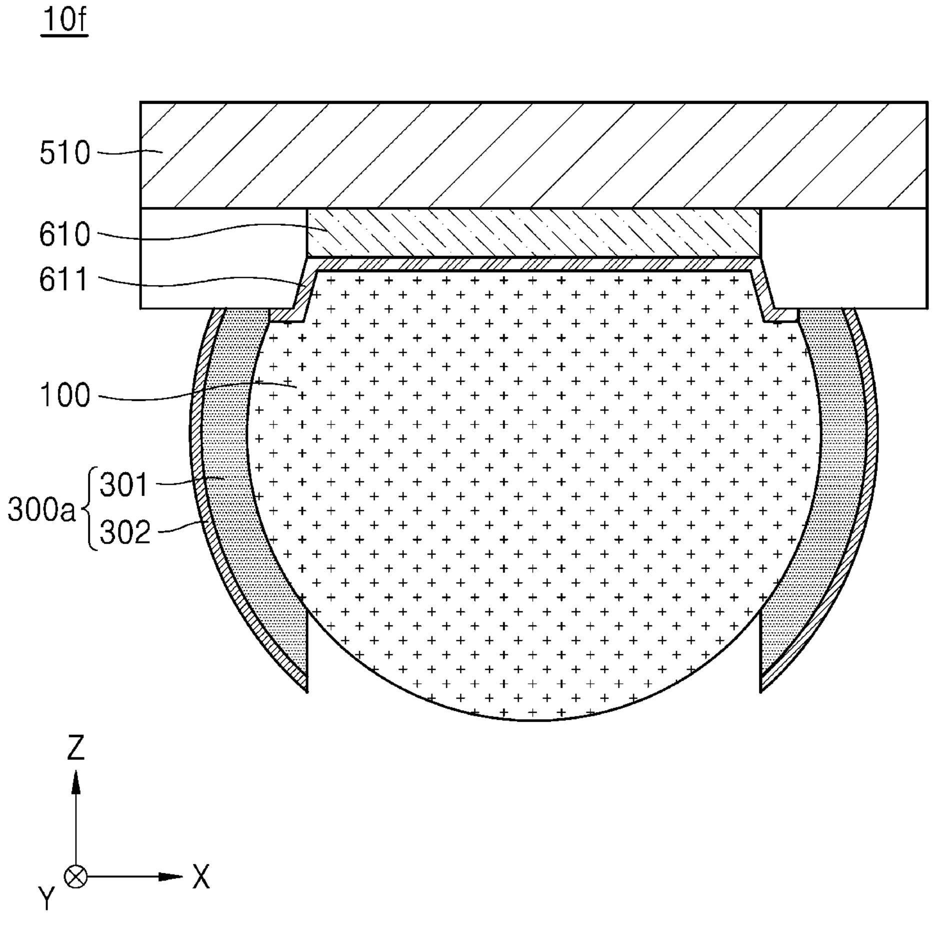
FIG. 7 is a schematic cross-sectional view of a semiconductor package according to an embodiment.

FIG. 7 is a schematic cross-sectional view of a semiconductor package according to an embodiment.

Hereinafter, redundant descriptions of the semiconductor package 10*d* of FIG. 5 are omitted, and a semiconductor package 10*f* of FIG. 7 is described focusing on the differences from the semiconductor package 10*d*.

The semiconductor package 10*f* may further include a first adhesive layer 302. The first adhesive layer 302 of the semiconductor package 10*f* may be on the outer surface of the blocking layer 301. In some embodiments, the first adhesive layer 302 may have a uniform thickness. The first adhesive layer 302 may cover the surface of the blocking layer 301. The first adhesive layer 302 may have a second hole in communication with a first hole of the blocking layer 301. In other words, the solder ball 100 may be exposed by the first and second holes to the outside.

The first adhesive layer 302 may stably combine solder paste thereon with the solder ball 100. In other words, the first adhesive layer 302 may have better wettability with respect to solder paste than the blocking layer 301 and thus increase the bonding force between the solder paste and the solder ball 100. The semiconductor package 10*f* may increase bonding between solder paste and the solder ball 100 via the first adhesive layer 302, thereby increasing the reliability thereof.

In some embodiments, the first adhesive layer 302 may include at least one selected from the group consisting of Au, Co, Cr, Cu, Ti, W, and a compound thereof.

Figure 8:
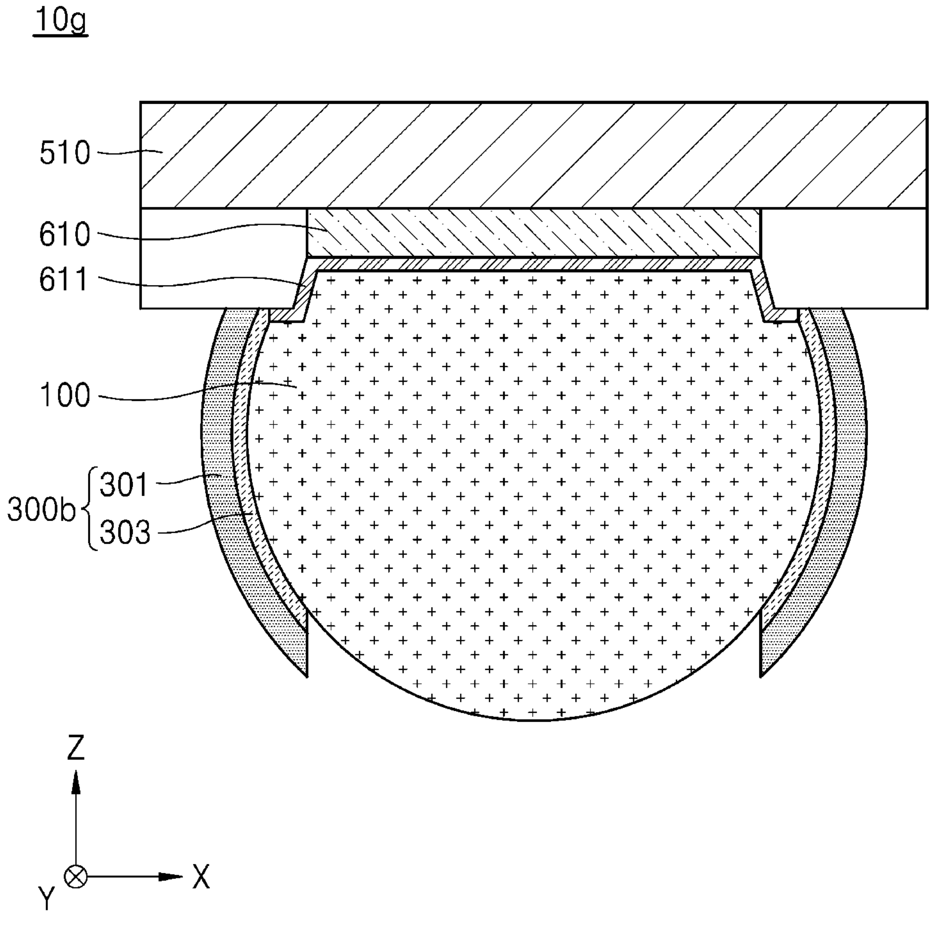
FIG. 8 is a schematic cross-sectional view of a semiconductor package according to an embodiment.

FIG. 8 is a schematic cross-sectional view of a semiconductor package according to an embodiment.

Hereinafter, redundant descriptions of the semiconductor package 10*d* of FIG. 5 are omitted, and a semiconductor package 10*g* of FIG. 8 is described focusing on the differences from the semiconductor package 10*d*.

The semiconductor package 10*g* may further include a second adhesive layer 303. The second adhesive layer 303 of the semiconductor package 10*g* may be between the blocking layer 301 and the solder ball 100. In some embodiments, the second adhesive layer 303 may have a uniform thickness. The second adhesive layer 303 may cover the surface of the solder ball 100. The second adhesive layer 303 may have a third hole in communication with the first hole of the blocking layer 301. In other words, the solder ball 100 may be exposed by the first and third holes to the outside.

The second adhesive layer 303 may stably combine the blocking layer 301 thereon with the solder ball 100. In other words, the second adhesive layer 303 may provide better bonding to the solder ball 100 than the blocking layer 301 and thus increase the bonding force between the blocking layer 301 and the solder ball 100. When the bonding force between the blocking layer 301 and the solder ball 100 is increased, the reliability of the semiconductor package 10*g* may also be increased.

In some embodiments, the blocking layer 301 may include Ni, B, P, or a compound thereof. In some embodiments, the second adhesive layer 303 may include at least one selected from the group consisting of Au, Co, Cr, Cu, Ti, W, and a compound thereof. In some embodiments, the second adhesive layer 303 may include a different material than the blocking layer 301.

Figure 9:
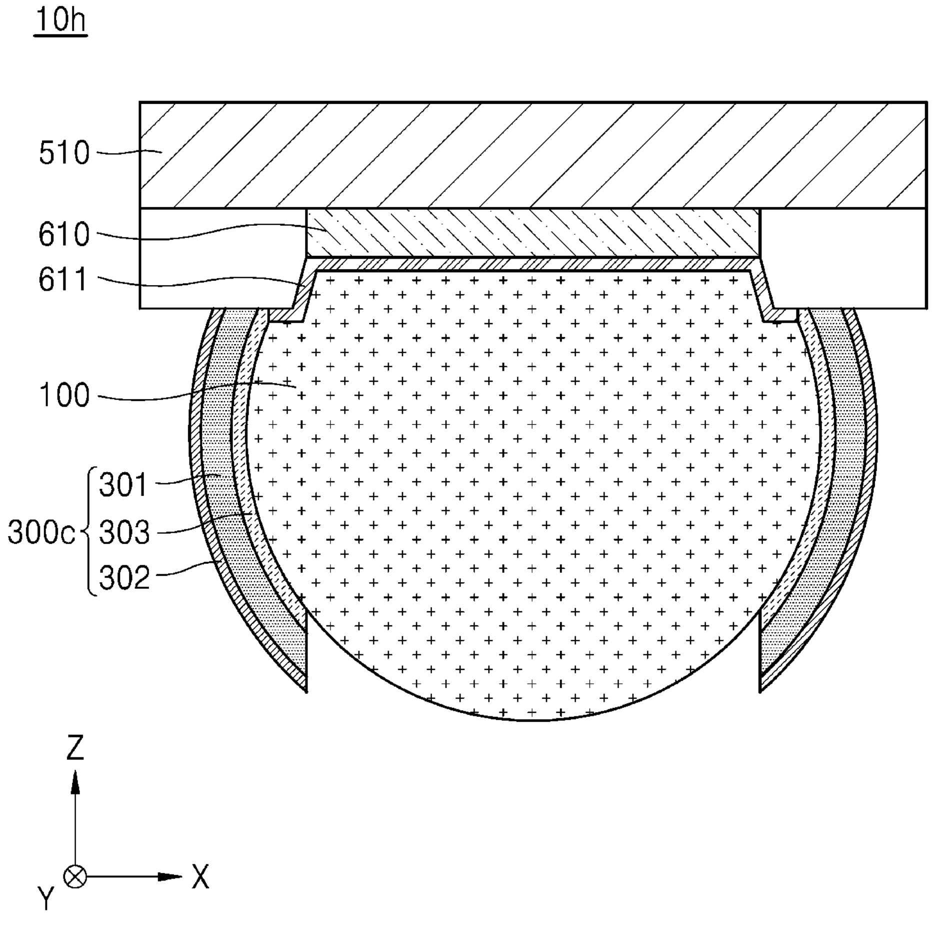
FIG. 9 is a schematic cross-sectional view of a semiconductor package according to an embodiment.

FIG. 9 is a schematic cross-sectional view of a semiconductor package according to an embodiment.

Hereinafter, redundant descriptions of the semiconductor package 10*d* of FIG. 5 are omitted, and a semiconductor package 10*h* of FIG. 9 is described focusing on the differences from the semiconductor package 10*d*.

The semiconductor package 10*h* may further include the first adhesive layer 302 and the second adhesive layer 303. The first adhesive layer 302 of the semiconductor package 10*h* may be on the outer surface of the blocking layer 301. The first adhesive layer 302 may cover the surface of the blocking layer 301. The first adhesive layer 302 may have a second hole in communication with the first hole of the blocking layer 301. The second adhesive layer 303 of the semiconductor package 10*h* may be between the blocking layer 301 and the solder ball 100. The second adhesive layer 303 may cover the surface of the solder ball 100. The second adhesive layer 303 may have a third hole in communication with the first and second holes. The solder ball 100 may be exposed by the first to third holes to the outside.

The first adhesive layer 302 may stably combine solder paste thereon with the solder ball 100. In other words, the first adhesive layer 302 may have better wettability with respect to solder paste than the blocking layer 301 and thus increase the bonding force between the solder paste and the solder ball 100. The semiconductor package 10*h* may increase bonding between solder paste and the solder ball 100 via the first adhesive layer 302, thereby increasing the reliability thereof.

The second adhesive layer 303 may stably combine the blocking layer 301 thereon with the solder ball 100. In other words, the second adhesive layer 303 may provide better bonding to the solder ball 100 than the blocking layer 301 and thus increase the bonding force between the blocking layer 301 and the solder ball 100. When the bonding force between the blocking layer 301 and the solder ball 100 is increased, the reliability of the semiconductor package 10*h* may also be increased.

In some embodiments, the first adhesive layer 302 and the second adhesive layer 303 may include at least one selected from the group consisting of Au, Co, Cr, Cu, Ti, W, and a compound thereof.

In some embodiments, the blocking layer 301, the first adhesive layer 302, and the second adhesive layer 303 may be formed after the solder ball 100 is attached to the first bonding pad 610. In some embodiments, the blocking layer 301, the first adhesive layer 302, and the second adhesive layer 303 may be formed by sputtering, vapor deposition, or the like. After the blocking layer 301, the first adhesive layer 302, and the second adhesive layer 303 are formed, the first to third holes may be formed by using a mask.

Figure 10A:
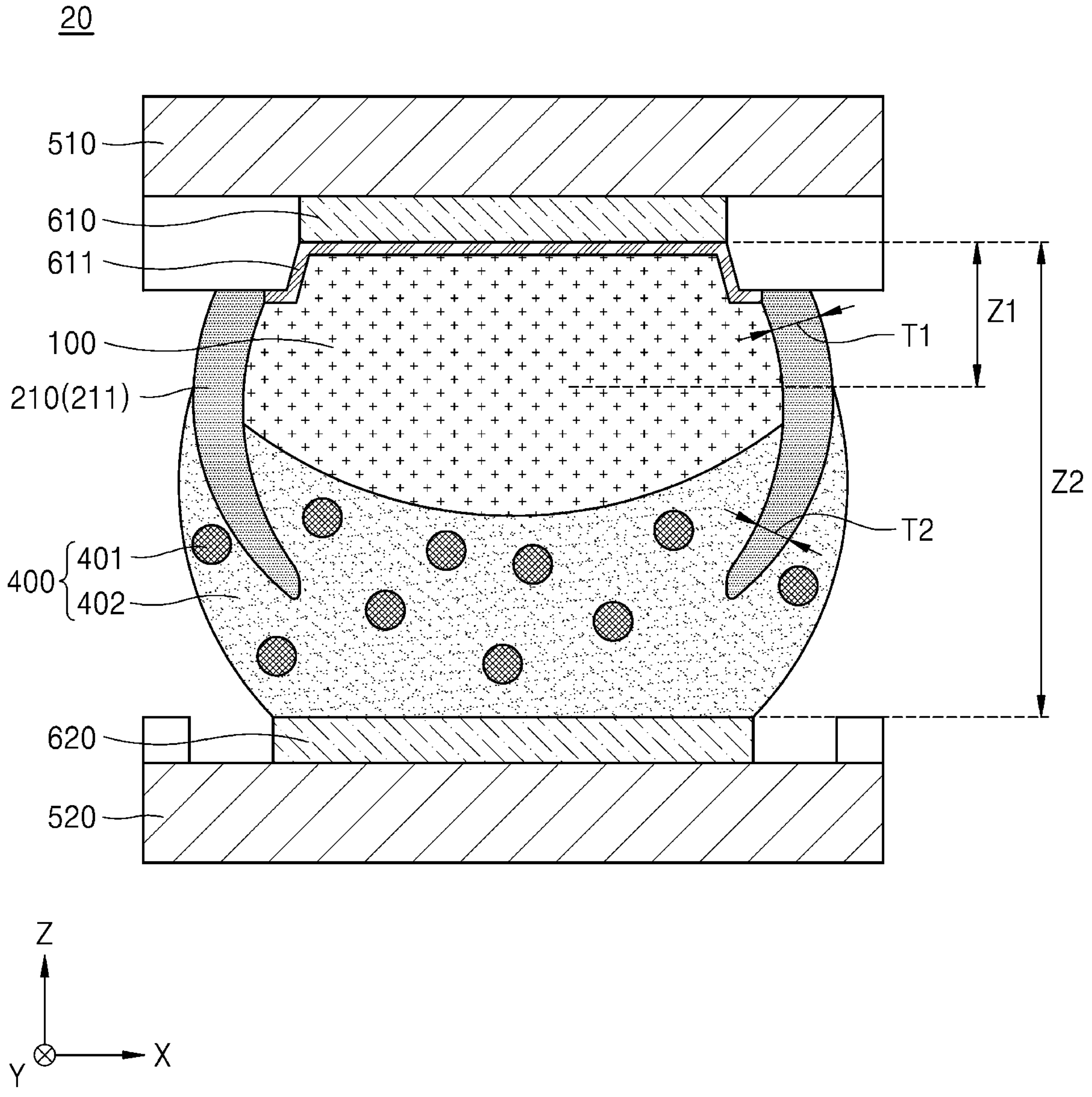
FIGS. 10A and 10B are schematic cross-sectional views of a semiconductor package according to an embodiment.
Figure 10B:
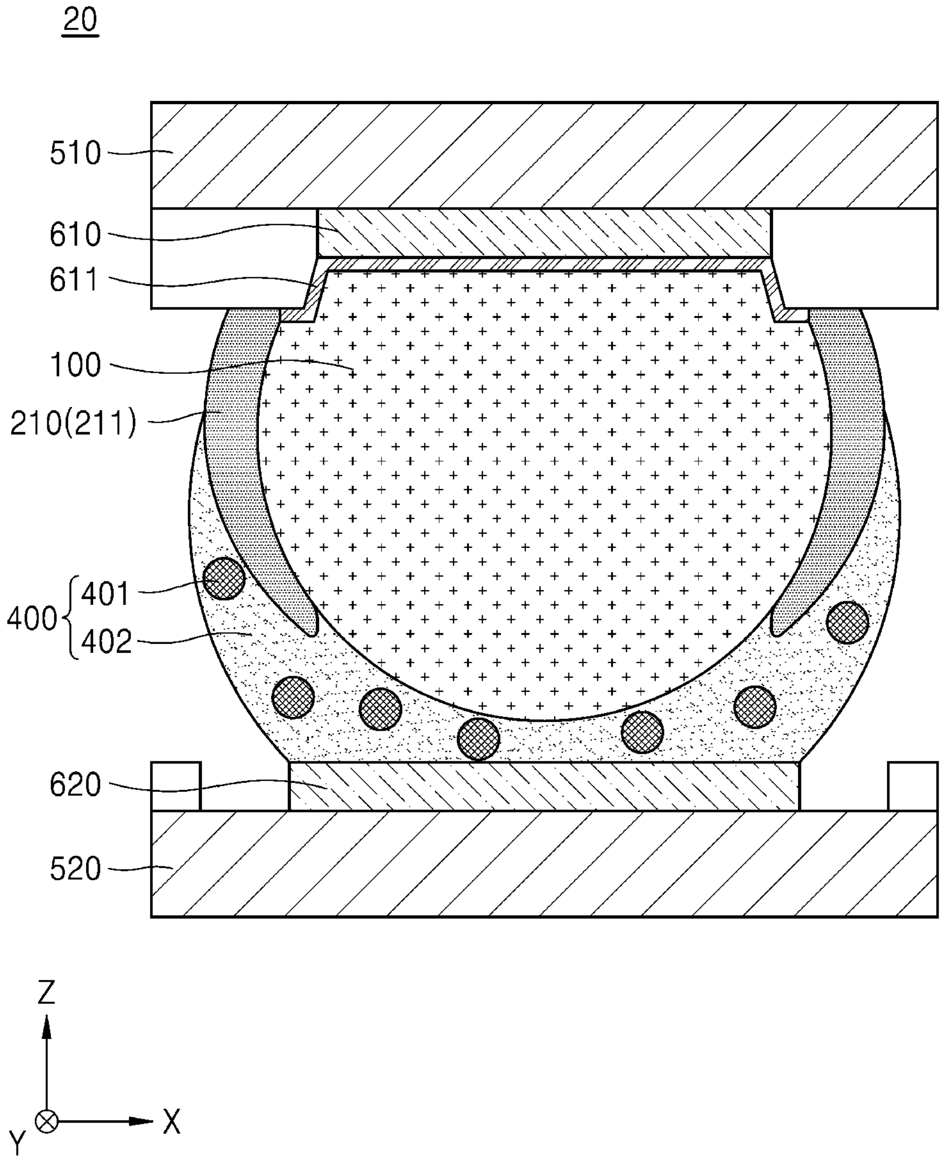

FIGS. 10A and 10B are schematic cross-sectional views of a semiconductor package according to an embodiment.

Referring to FIGS. 10A and 10B, a semiconductor package 20 may include the first substrate 510, a second substrate 520, the first bonding pad 610, a second bonding pad 620, solder paste 400, the solder ball 100, and a blocking layer 211. Hereinafter, redundant descriptions of the semiconductor package 10 of FIG. 1 are omitted, and the semiconductor package 20 of FIG. 10A is described focusing on the differences from the semiconductor package 10.

The second substrate 520 of the semiconductor package 20 may include a material (e.g., Si or Ge) having semiconductor properties, an insulating material (e.g., glass or quartz), or a semiconductor or conductor covered with an insulating material.

In an embodiment, the first substrate 510 may include a memory semiconductor chip. For example, the memory semiconductor chip may include a volatile memory semiconductor chip, such as a dynamic random access memory (DRAM) chip or a static RAM (SRAM) chip, or a non-volatile memory semiconductor chip, such as a phase-change RAM (PRAM) chip, a magnetoresistive RAM (MRAM) chip, a ferroelectric RAM (FeRAM) chip, or a resistive RAM (RRAM) chip. The second substrate 520 may include a memory semiconductor chip of the same type as or a different type from a memory semiconductor chip of the first substrate 510. However, embodiments are not limited thereto, and the second substrate 520 may include a logic semiconductor chip.

In an embodiment, the first substrate 510 may include a memory semiconductor chip or a logic semiconductor chip. The second substrate 520 may include a printed circuit board (PCB).

The second bonding pad 620 of the semiconductor package 20 may be formed on the second substrate 520 and may electrically connect the second substrate 520 to the solder ball 100.

For example, the first bonding pad 610 may include metal, such as Cu, Al, W, Ti, Ta, In, Mo, Mn, Co, Sn, Ni, Mg, Re, Be, Ga, or Ru, or an alloy thereof.

The solder paste 400 of the semiconductor package 20 may be on the second bonding pad 620. The solder paste 400 may be between the second bonding pad 620 and the first bonding pad 610. The solder paste 400 may be combined with the solder ball 100. The solder paste 400 may have a lower melting point than the solder ball 100. In other words, during a reflow process, the solder paste 400 may be melted at a low temperature and combined with the solder ball 100. In an embodiment, the melting point of the solder paste 400 may be lower than 210° C. and lower than the melting point of the solder ball 100.

The solder paste 400 may include a solder particle 401 and flux 402. The solder particle 401 may be a main component, and the flux 402 may be an auxiliary component.

For example, the solder particle 401 may include at least one selected from the group consisting of Bi, In, Zn, SnBiAg alloy, and SnBi alloy. For example, the solder particle 401 may include Sn58Bi.

For example, the flux 402 may include water-soluble flux and fat-soluble flux. The flux 402 may include at least one selected from the group consisting of rosin flux, resin flux, and organic acid flux. However, the flux 402 is not limited thereto.

The thickness of the blocking layer 211 of the semiconductor package 20 may vary in a direction away from the first substrate 510. In an embodiment, the thickness of the blocking layer 211 may decrease away from the first substrate 510. The thickness of the blocking layer 211 may decrease toward a region, in which the solder paste 400 is combined with the solder ball 100. In other words, the blocking layer 211 may have a first thickness T1 in a region adjacent to the first bonding pad 610 and a second thickness T2 in a region adjacent to a region in which the solder paste 400 is combined with the solder ball 100. The first thickness T1 may be greater than the second thickness T2. In an embodiment, the blocking layer 211 may include a hole in a region in which the solder paste 400 is combined with the solder ball 100. In an embodiment, the blocking layer 211 may include the blocking layer 201 in FIG. 1.

A distance Z1 between the solder paste 400 and the first bonding pad 610 may be about 10% to about 30% of a distance Z2 between the first bonding pad 610 and the second bonding pad 620. In other words, a length in the vertical direction of the solder paste 400 may be about 70% 10% to about 90% of the distance Z2 between the first bonding pad 610 and the second bonding pad 620. In other words, the solder paste 400 may not diffuse to the first bonding pad 610.

In some embodiments, the solder paste 400 may surround the inner and outer surfaces of a portion of the blocking layer 211. In other words, the solder particle 401 of the solder paste 400 may diffuse into the solder ball 100 and partially surround the inner and outer surfaces of the blocking layer 211.

In some embodiments, the solder paste 400 may surround the outer surface of the blocking layer 211. In other words, the solder particle 401 of the solder paste 400 may not diffuse into the solder ball 100 and not be in contact with the inner surface of the blocking layer 211.

The blocking layer 211 of the semiconductor package 20 may suppress the solder paste 400 from diffusing to the first bonding pad 610. When the solder paste 400 diffuses to the boundary between the first bonding pad 610 and the solder ball 100, the semiconductor package 20 may be broken by even a small impact. When diffusion of the solder paste 400 is suppressed by using the blocking layer 211, the reliability of the semiconductor package 20 may be increased.

Figure 11:
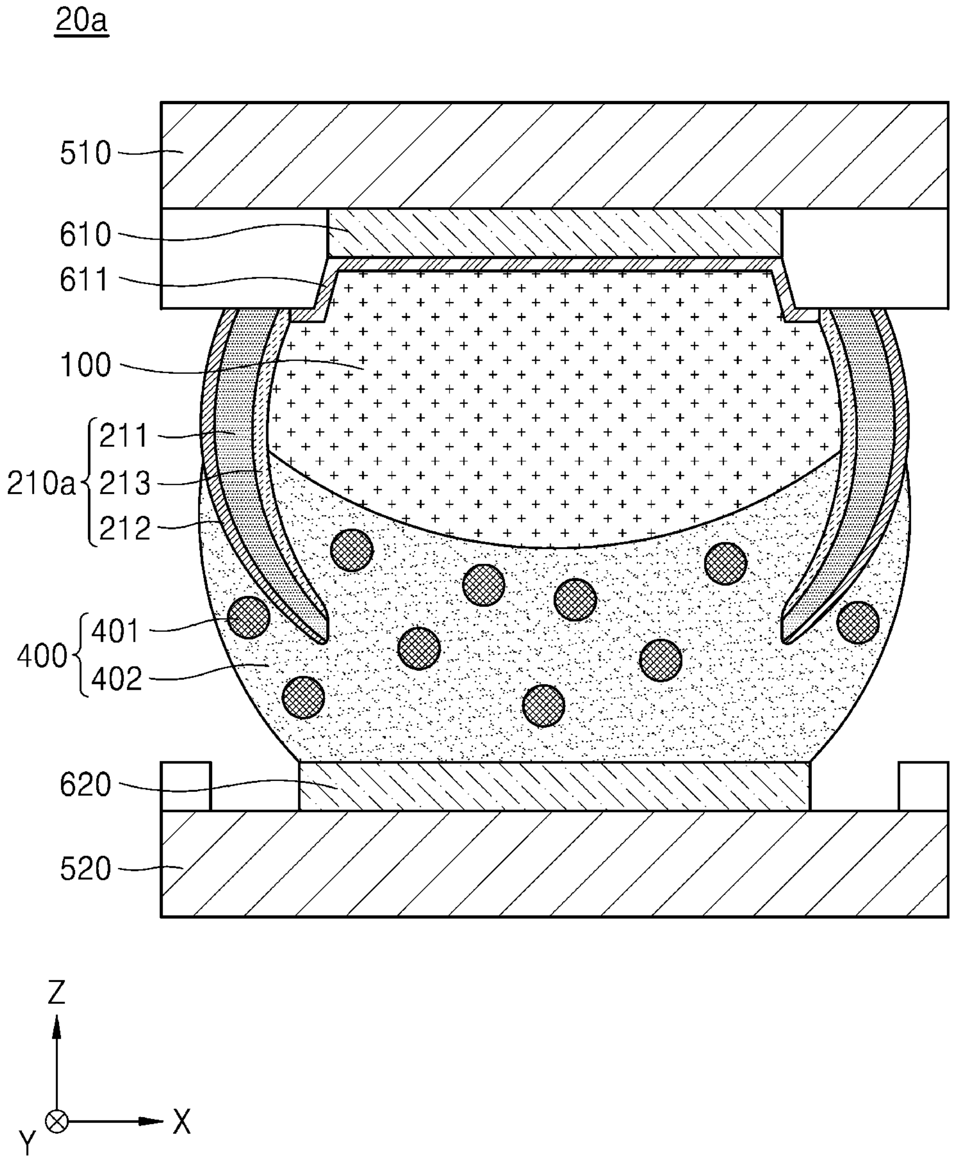
FIG. 11 is a schematic cross-sectional view of a semiconductor package according to an embodiment.

FIG. 11 is a schematic cross-sectional view of a semiconductor package according to an embodiment.

Hereinafter, redundant descriptions of the semiconductor package 20 of FIG. 10A are omitted, and a semiconductor package 20*a* of FIG. 11 is described focusing on the differences from the semiconductor package 20.

The semiconductor package 20*a* may further include a first adhesive layer 212 and a second adhesive layer 213. The first adhesive layer 212 may be between the blocking layer 211 and the solder paste 400. The second adhesive layer 213 may be between the blocking layer 211 and the solder ball 100. The first adhesive layer 212 may include the first adhesive layer 202 in FIG. 2. The second adhesive layer 213 may include the second adhesive layer 203 in FIG. 3.

In some embodiments, the first adhesive layer 212 and the second adhesive layer 213 may include at least one selected from the group consisting of Au, Co, Cr, Cu, Ti, W, and a compound thereof.

The first and second adhesive layers 212 and 213 may include a different material than the blocking layer 211. The first adhesive layer 212 may provide better bonding to the solder ball 100 than the blocking layer 211 and thus increase the reliability of the semiconductor package 20*a*. The second adhesive layer 213 may provide better bonding to the solder paste 400 than the blocking layer 211 and thus increase the reliability of the semiconductor package 20*a*.

Although it is illustrated in FIG. 11 that the semiconductor package 20*a* includes the first adhesive layer 212 and the second adhesive layer 213, embodiments are not limited thereto. According to an embodiment, a semiconductor package 20*a* may include at least one of the first and second adhesive layers 212 and 213.

Figure 12A:
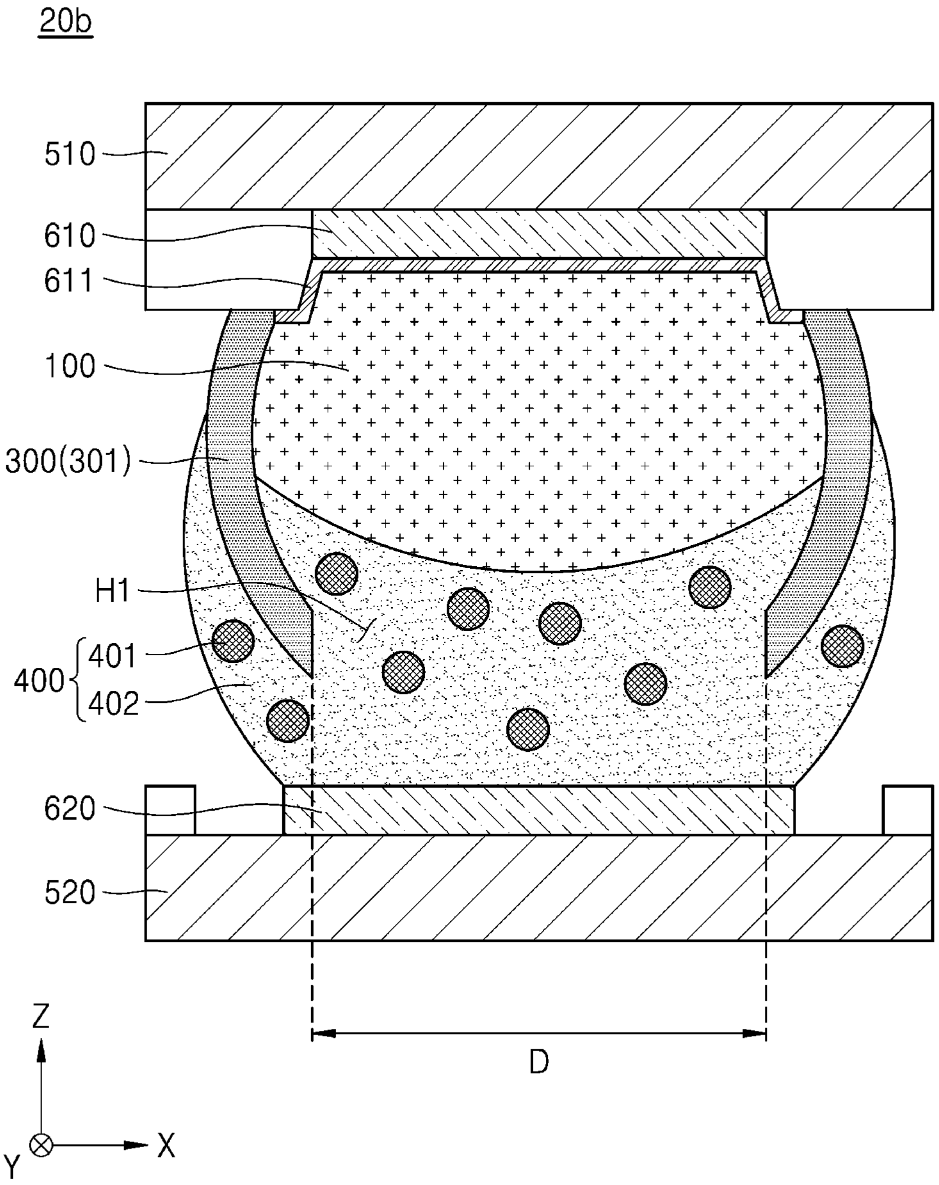
FIGS. 12A and 12B are schematic cross-sectional views of a semiconductor package according to an embodiment.
Figure 12B:
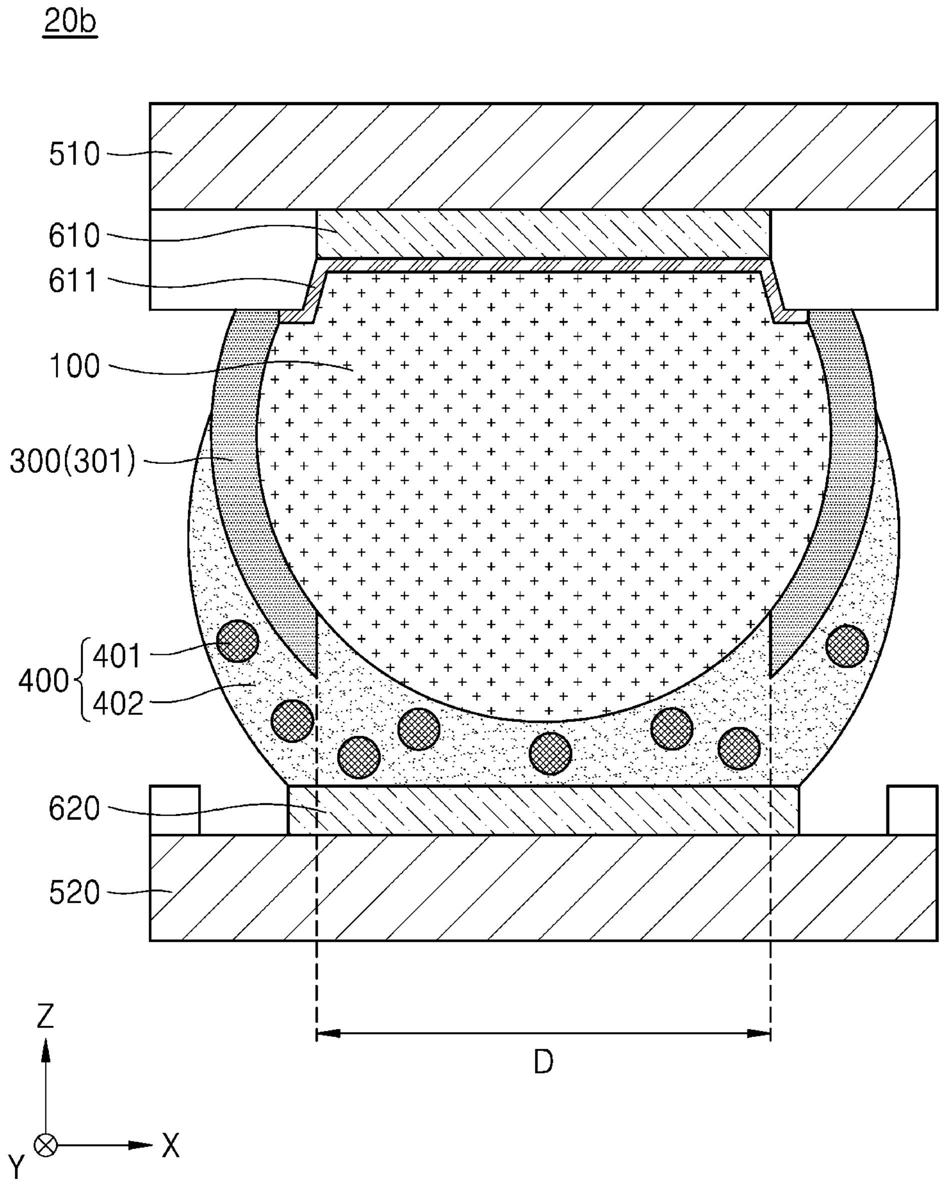

FIGS. 12A and 12B are schematic cross-sectional views of a semiconductor package according to an embodiment.

Hereinafter, redundant descriptions of the semiconductor package 20 of FIG. 10A are omitted, and a semiconductor package 20*b* of FIGS. 12A and 12B is described focusing on the differences from the semiconductor package 20.

The blocking layer 301 of the semiconductor package 20*b* may be formed on the solder ball 100. The blocking layer 301 may have the first hole H1. The first hole H1 may extend from the outer surface of the blocking layer 301 to the inner surface of the blocking layer 301.

The solder ball 100 may be combined with the solder paste 400 in the first hole H1. In other words, the solder ball 100 may contact the solder paste 400 through the first hole H1. During a reflow process, the solder paste 400 may be combined with the solder ball 100 in the first hole H1. In other words, the solder particle 401 of the solder paste 400 may diffuse to the solder ball 100 through the first hole H1. The solder paste 400 may be combined with the solder ball 100 in the first hole H1 and may thus partially surround the inner and outer surfaces of the blocking layer 301. In an embodiment, the blocking layer 301 may include the blocking layer 301 in FIG. 5.

In some embodiments, the solder paste 400 may surround the inner and outer surfaces of the blocking layer 301. In other words, the solder particle 401 of the solder paste 400 may diffuse into the solder ball 100 and thus surround the inner and outer surfaces of the blocking layer 301.

In some embodiments, the solder paste 400 may surround the outer surface of the blocking layer 301. In other words, the solder particle 401 of the solder paste 400 may not diffuse into the solder ball 100 and thus not contact the inner surface of the blocking layer 301.

The semiconductor package 20*b* may suppress the solder paste 400 from diffusing to the first bonding pad 610 by using the blocking layer 301. When the solder paste 400 diffuses to the boundary between the first bonding pad 610 and the solder ball 100, the semiconductor package 20*b* may be broken by even a small impact. When diffusion of the solder paste 400 is suppressed by using the blocking layer 301, the reliability of the semiconductor package 20*b* may be increased.

Figure 13:
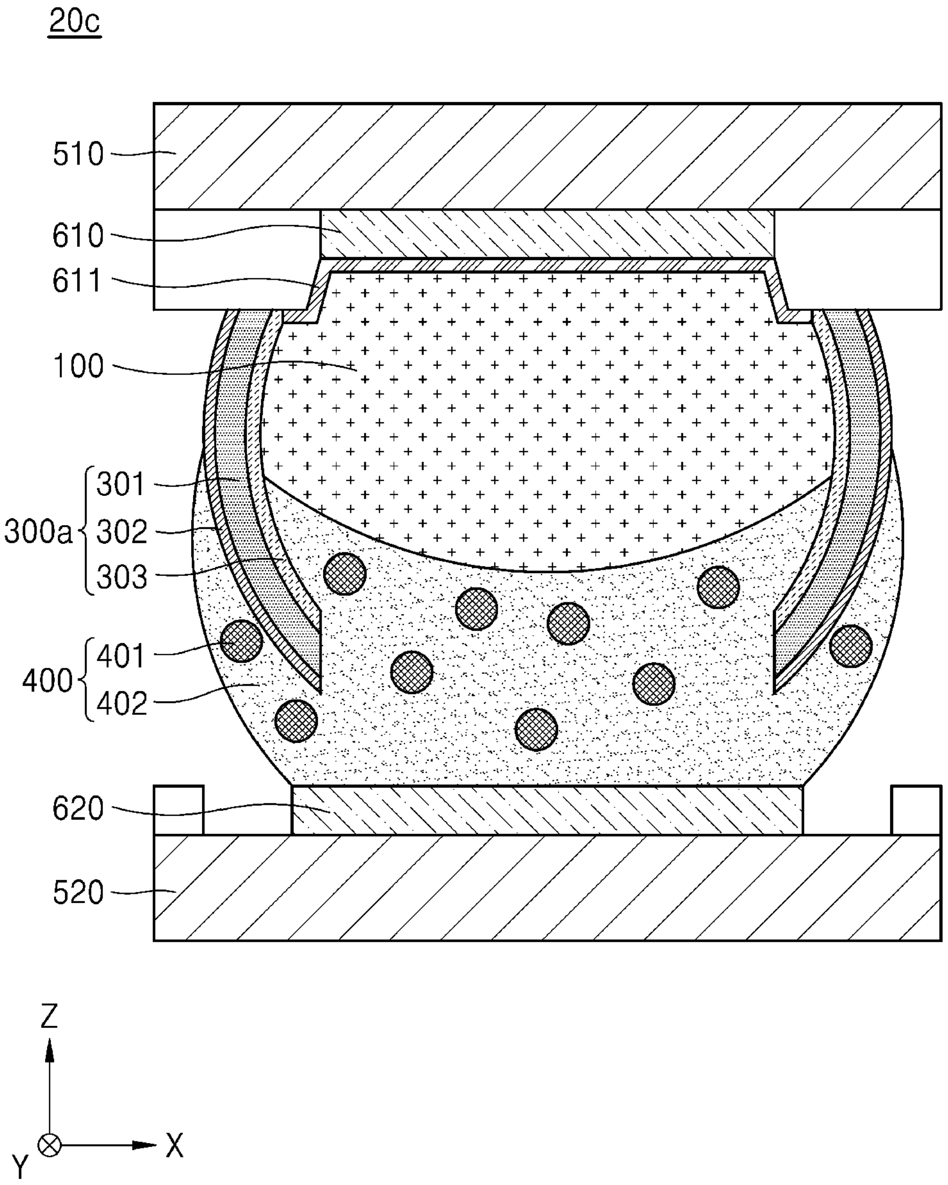
FIG. 13 is a schematic cross-sectional view of a semiconductor package according to an embodiment.

FIG. 13 is a schematic cross-sectional view of a semiconductor package according to an embodiment.

Hereinafter, redundant descriptions of the semiconductor package 20*b* of FIG. 12A are omitted, and a semiconductor package 20*c* of FIG. 13 is described focusing on the differences from the semiconductor package 20*b*.

The semiconductor package 20*c* may further include the first adhesive layer 302 and the second adhesive layer 303. The first adhesive layer 302 may have a second hole in communication with a first hole of the blocking layer 301. The second adhesive layer 303 may have a third hole in communication with the first and second holes. The second hole may extend from the outer surface of the first adhesive layer 302 to the inner surface of the first adhesive layer 302. The third hole may extend from the outer surface of the second adhesive layer 303 to the inner surface of the first adhesive layer 303. In some embodiments, the solder ball 100 may be combined with the solder paste 400 in the first to third holes. In some embodiments, the first adhesive layer 302 may include the first adhesive layer 302 in FIG. 7, and the second adhesive layer 303 may include the second adhesive layer 303 in FIG. 8.

The first and second adhesive layers 302 and 303 may include a different material than the blocking layer 301. The first adhesive layer 302 may provide better bonding to the solder paste 400 than the blocking layer 301 and thus increase the reliability of the semiconductor package 20*c*. The second adhesive layer 303 may provide better bonding to the solder ball 100 than the blocking layer 301 and thus increase the reliability of the semiconductor package 20*c*.

Although it is illustrated in FIG. 13 that the semiconductor package 20*c* includes the first adhesive layer 302 and the second adhesive layer 303, embodiments are not limited thereto. According to an embodiment, a semiconductor package may include at least one of the first and second adhesive layers 302 and 303.

While the inventive concept has been particularly shown and described with reference to embodiments thereof, it will be understood that various changes in form and details may be made therein without departing from the spirit and scope of the following claims.

What is claimed is:

1. A semiconductor package comprising:

a first substrate;

a first bonding pad on the first substrate;

a solder ball on the first bonding pad; and a blocking layer on the solder ball, wherein a thickness of the blocking layer varies in a direction away from the first substrate.

2. The semiconductor package of claim 1, further comprising a first adhesive layer on an outer surface of the blocking layer, wherein the first adhesive layer includes a different material than the blocking layer.

3. The semiconductor package of claim 1, further comprising a second adhesive layer between the blocking layer and the solder ball, wherein the second adhesive layer includes a material different from a material of the blocking layer.

4. The semiconductor package of claim 1, wherein the blocking layer includes a first region and a second region, the first region is apart from the first substrate, the second region is between the first substrate and the first region, and the blocking layer is thinner in the first region than in the second region.

5. The semiconductor package of claim 4, wherein the thickness of the blocking layer is about 0.05 μm to about 0.2 μm in the first region and about 0.2 μm to about 0.4 μm in the second region.

6. The semiconductor package of claim 1, further comprising:

a first adhesive layer on an outer surface of the blocking layer; and a second adhesive layer between the blocking layer and the solder ball, wherein the first adhesive layer includes a material different from a material of the blocking layer, and the second adhesive layer includes a material different from the material of the blocking layer.

7. The semiconductor package of claim 6, wherein the blocking layer includes at least one selected from the group consisting of nickel (Ni), boron (B), phosphorous (P), and a compound thereof, and the first adhesive layer and the second adhesive layer each include at least one selected from the group consisting of gold (Au), cobalt (Co), chromium (Cr), copper (Cu), titanium (Ti), tungsten (W), and a compound thereof.

8. The semiconductor package of claim 1, further comprising a second substrate separated from the first substrate by the solder ball therebetween;

a second bonding pad on the second substrate; and solder paste between the second bonding pad and the first bonding pad, wherein the solder paste is combined with the solder ball, and the solder ball has a higher melting point than the solder paste.

9. The semiconductor package of claim 8, wherein a distance between the first bonding pad and the solder paste is about 10% to about 30% of a distance between the first bonding pad and the second bonding pad.

10. The semiconductor package of claim 8, wherein the solder paste includes bismuth (Bi).

11. A semiconductor package comprising:

a first substrate;

a first bonding pad on the first substrate;

a solder ball on the first bonding pad;

a blocking layer on the solder ball and having a first hole; and solder paste surrounding at least a portion of each of an outer surface of the blocking layer and an inner surface of the blocking layer, wherein the first hole extends from the outer surface of the blocking layer to the inner surface of the blocking layer.

12. The semiconductor package of claim 11, wherein the blocking layer includes a first region and a second region, the first region is apart from the first substrate, the second region is between the first substrate and the first region, and the first hole is in the first region.

13. The semiconductor package of claim 11, wherein an area of the first hole is about 30% to about 70% of an area of the solder ball.

14. The semiconductor package of claim 11, wherein the first hole has one of a circular shape, an elliptical shape, a quadrangular shape, and a hexagonal shape.

15. The semiconductor package of claim 11, further comprising a first adhesive layer on the blocking layer, wherein the first adhesive layer has a second hole in communication with the first hole.

16. The semiconductor package of claim 15, wherein the blocking layer includes at least one selected from the group consisting of nickel (Ni), boron (B), phosphorous (P), and a compound thereof, and the first adhesive layer includes at least one selected from the group consisting of gold (Au), cobalt (Co), chromium (Cr), copper (Cu), titanium (Ti), tungsten (W), and a compound thereof.

17. The semiconductor package of claim 11, further comprising a second substrate separated from the first substrate by the solder ball therebetween;

a second bonding pad on the second substrate, wherein the solder paste is combined with the solder ball, and the solder ball has a higher melting point than the solder paste.

18. The semiconductor package of claim 17, wherein a distance between the first bonding pad and the solder paste is about 10% to about 30% of a distance between the first bonding pad and the second bonding pad.

19. The semiconductor package of claim 17, wherein the solder paste is combined with the solder ball in the first hole.

20. A semiconductor package comprising:

a first substrate;

a first bonding pad on the first substrate;

a solder ball on the first bonding pad;

a blocking layer on the solder ball;

a second substrate separated from the first substrate by the solder ball therebetween;

a second bonding pad on the second substrate; and solder paste on the second bonding pad and combined with the solder ball, wherein a thickness of the blocking layer decreases in a direction toward the second substrate, the solder ball has a higher melting point than the solder paste, and a distance between the first bonding pad and the solder paste is about 10% to about 30% of a distance between the first bonding pad and the second bonding pad.

* * * * *